United States Patent [19]

Sutherland et al.

[11] Patent Number: 4,470,041

[45] Date of Patent: Sep. 4, 1984

[54] EFFICIENT COMPUTER INPUT SYSTEM FOR SENSING STATUS OF HIGH VOLTAGE CONTACTS

[75] Inventors: James F. Sutherland, Pittsburgh; Henry F. Cook, Penn Hills Township, Allegheny County, both of Pa.

[73] Assignee: Westinghouse Electric Corp., Pittsburgh, Pa.

[21] Appl. No.: 318,223

[22] Filed: Nov. 4, 1981

[51] Int. Cl.³ ............................................. G08B 21/00
[52] U.S. Cl. ................................... 340/644; 340/654; 340/660; 340/652; 323/288; 323/290
[58] Field of Search ............... 340/644, 638, 639, 652, 340/654, 660, 664; 324/422, 418; 323/271, 272, 288, 290, 274, 281

[56] References Cited

U.S. PATENT DOCUMENTS 3,346,855 10/1967 Bishop .................................. 340/644
3,678,344 7/1972 Wedmore ............................ 340/644
4,340,852 7/1982 Togneri ............................... 340/644

Primary Examiner—Gerald L. Brigance
Attorney, Agent, or Firm—E. Langer

[57] ABSTRACT

An apparatus is provided for sensing the state of high voltage contact inputs in a process control system. Lower voltage contact closure input modules cooperate with a reference bus and reference bus regulator to reduce the voltage drop across an input module when a pair of contacts is closed, thereby reducing the energy dissipated and heat created by the input module.

9 Claims, 2 Drawing Figures

EFFICIENT COMPUTER INPUT SYSTEM FOR SENSING STATUS OF HIGH VOLTAGE CONTACTS

BACKGROUND OF THE INVENTION

The present invention relates generally to computer-based process control systems and more particularly to an apparatus for reducing heat dissipation by a plurality of high voltage contact closure inputs in a process control system.

Many industrial process control systems employ computers as an efficient means for controlling a complex operation. One method by which a process control computer is informed of the status of a given process is by monitoring the state of relay contacts. Relays, or any other devices which may open or close contacts in response to a stimulus from a process under control, are positioned with a process apparatus so as to indicate the status of certain elements of the process apparatus, such as motors or switches. To provide status information to the computer, a current loop is established from a power supply, through the relay contacts, through a contact closure input module and back to the power supply. When the relay contacts are closed, current flows through the loop and the input module provides a signal to the computer indicating the state of the contacts. Relay contacts may be either normally open or normally closed, as control system specifications demand. It is not uncommon for a large process control system to involve monitoring the state of several thousand relay contacts.

The contact closure input modules are typically current sensitive devices. When the connected relay contacts are closed, the full voltage of the current loop power supply is applied across the input module. Each input module generally contains a dropping resistor in series with a light-emitting diode (LED) of an optoisolator. When current flows through the module, the dropping resistor dissipates most of the power supply voltage. Voltage not dissipated by the dropping resistor activates the LED, ultimately signalling to the computer that a relay has been operated. Where the current loop power supply is a relatively high voltage supply, such as 125 volts DC, the heat generated by the dropping resistor can be substantial.

The present trend toward increasing the complexity of process control systems is parallelled by efforts to increase the efficiency and thereby decrease the cost of existing process control techniques. One method of increasing system efficiency is to redesign control system architecture to reduce the number of cables concentrated at the process control computer. By establishing remote data collection cabinets to house the input modules for a plurality of relay contacts located within a given area, the contact status of many contact relays may be communicated to the process control computer over a single coaxial cable or pair of wires.

The remote data collection cabinets are located as close as possible to the relay contacts connected to that cabinet. This often requires that the data collection cabinets be placed in extremely hostile electrical and thermal environments. Large electromagnetic fields, wide variations in ambient temperature and dusty working conditions mandate use of a dust-tight, electrically conductive enclosure for the data collection cabinet. While providing an effective defense against a harsh environment, the sealed enclosures do not permit dissipation of heat generated by electronic circuits within the enclosure. If the circuits located within the enclosure generate too much heat, the rate of failure of the enclosed circuits increases and the cost effectiveness of the data collection cabinets is defeated.

The problem of heat dissipation is compounded when system specifications necessitate use of a high voltage power supply, such as 125 volts DC, to sense contact status. Existing input modules utilize optoisolators to convert the contact closure input signal, typically a direct current of 10 to 15 milliamperes, to a signal recognized by the process control computer. The energized LED of the optoisolator activates a phototransistor which causes a switching action in logical devices connected to the computer. Hence, the contact closure input module converts the direct current input signal to a DC voltage signal at the computer. The dropping resistor within the input module is used to reduce the 125 volt DC input signal to approximately 1.7 volt DC, which is the forward bias voltage across the LED of the optoisolator. As a result, the dropping resistor may dissipate as much as 1.85 watts in each input module. A plurality of input modules, each utilizing a contact-sensing voltage of 125 volts DC, may easily give rise to excessive temperatures within a sealed data collection cabinet.

It would therefore be advantageous to develop an improved scheme for sensing the status of high voltage relay contacts within a sealed data collection cabinet which can be located in hostile process environments near the relays. Such a scheme should reduce the heat dissipated by a contact closure input module when the connected relay contacts are closed, so as to permit collection of a plurality of such modules in the sealed enclosure without danger of overheating.

SUMMARY OF THE INVENTION

Accordingly, an arrangement by which a computer can determine the state of high voltage relay contacts is provided for improving the efficiency and reliability of sensing system performance. A lower voltage input module is utilized in cooperation with a reference bus and a reference bus regulator. The input module and corresponding relay contacts are connected between a high voltage power supply and the reference bus. The reference bus is maintained at an intermediate reference bus level by the voltage regulator. When the relay contacts are closed, the energy dissipated by a dropping resistor within the input module is substantially less than the energy which would be dissipated by that same resistor in a scheme where the full voltage of the high voltage power supply is applied to the input module. The reference regulator operates in a switching mode to return energy to the high voltage power supply, thereby minimizing the energy dissipated within the sensing system.

DESCRIPTION OF THE PREFERRED EMBODIMENT

Figure 1:
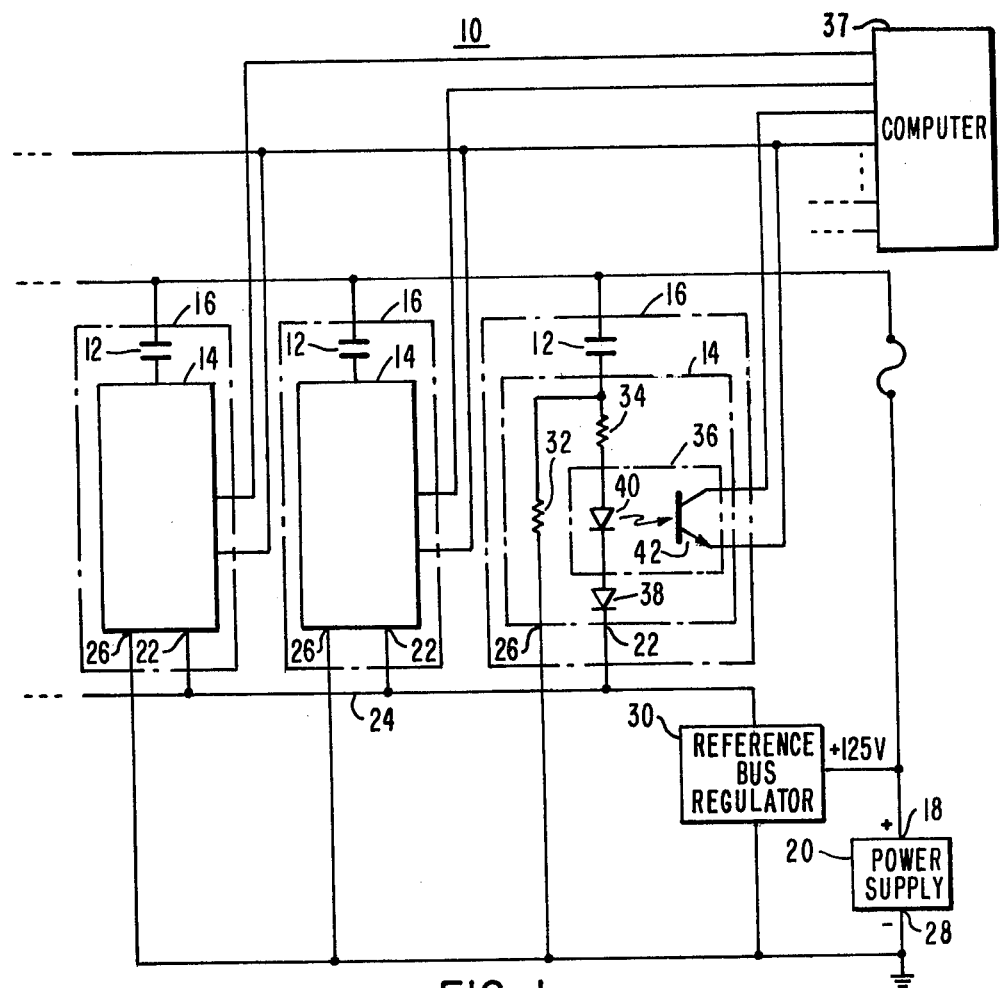
FIG. 1 shows an arrangement of apparatus for sensing the state of high voltage contacts.

FIG. 1 discloses an arrangement 10 for computer sensing of the status of high voltage relay contacts 12.

Each of a plurality of relay contacts 12 is connected to a contact closure input module 14. Each combination 16 of relay contacts 12 and input module 14 is connected in parallel with every other combination 16 of relay contacts 12 and input module 14. Each pair of contacts 12 is also connected to a positive terminal 18 on a high voltage power supply 20.

One terminal 22 of each input module 14 is connected to a reference bus 24, while another terminal 26 from each input module is connected to a negative terminal 28 on the high voltage power supply 20. A voltage controlling means, or reference bus regulator 30, which is connected across the high voltage power supply 20, maintains the reference bus 24 at a relatively constant voltage. One reference bus regulator 30 may be connected to a plurality of input modules 14 grouped together in a single data collection cabinet (not shown).

In the embodiment described herein, the high voltage power supply 20 generates 125 volts DC. The reference bus regulator 30 maintains the reference bus 24 at a level of approximately 100 volts DC. The input modules 14 are commercially available devices which are normally employed with a 24 volt DC power supply.

Each contact closure input module 14 typically comprises a pair of resistors 32, 34, an optoisolator 36 and a diode 38. A first resistor 32 is typically a very high resistance which serves to apply the full 125 volt power supply voltage across the open relay contacts 12. The first resistor 32 also serves to reverse bias the diode 38, protecting the optoisolator 36 from noise transients.

When the relay contacts 12 close, a current path is established from the positive terminal 18 of the power supply 20 through the relay contacts 12, through a second resistor 34, or dropping resistor, within the input module 14, through the optoisolator 36, the diode 38, and the reference bus regulator 30, and back to the negative terminal 28 of the high voltage power supply 20. Current flowing through a light-emitting diode (LED) 40 of the optoisolator 36 energizes a phototransistor 42 of the optoisolator 36, which generates a signal to the process computer 37, indicating that the connected pair of relay contacts has closed.

Employment of a reference bus 24 and reference bus regulator 30 enables a reduction of the voltage drop across the input module 14. The 125 volt DC power supply voltage which is dropped across the input module of prior art schemes when the relay contacts are closed is reduced to a 25 volt potential difference, the difference between the power supply voltage and the reference bus voltage. Consequently, the voltage across the dropping resistor 34 when the relay contacts are closed is on the order of 23.3 volts, as compared to a 123.3 volt drop across the same resistor 34 in an arrangement which does not utilize the reference bus 24 and reference bus regulator 30.

The energy dissipated by the dropping resistor 34 in a scheme utilizing the reference bus 24 is substantially less than the energy dissipated by the dropping resistor 34 in a scheme which does not use the reference bus 24. The proposed arrangement 10 thus permits a substantial increase in the number of high voltage contact closure input modules 14 which may be congregated in a single sealed enclosure without incurring damage to enclosed electronics due to overheating.

Figure 2:
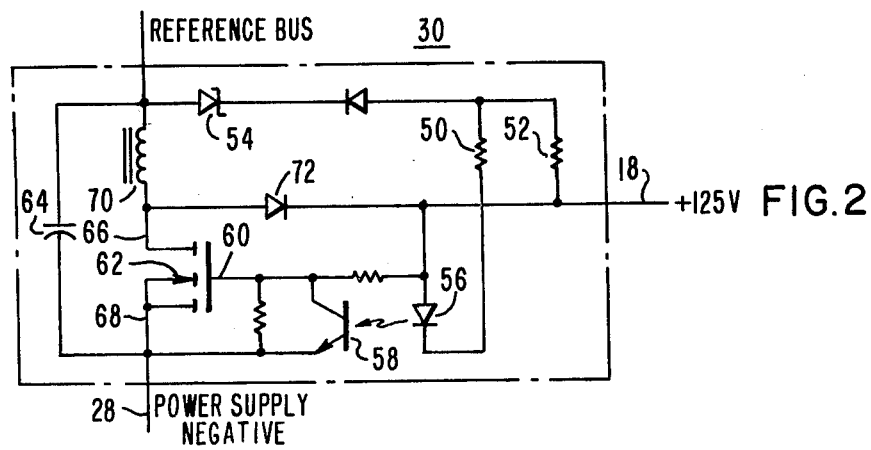
FIG. 2 shows a schematic diagram for a reference bus regulator.

FIG. 2 discloses a circuit diagram embodiment of the reference bus regulator 30. The reference bus regulator 30 operates in a switching mode, the reference bus voltage oscillating between approximately 100 volts and 105 volts DC. A stable reference bus voltage is not required for the proper operation of this scheme 10.

To demonstrate the operation of the reference bus regulator 30, it is assumed that the reference bus voltage is now at the 100 volt DC level and is decreasing. The magnitudes of two resistors 50, 52, and the breakdown voltage of a Zener diode 54 are chosen so that the Zener diode 54 breaks down when the reference bus voltage falls to the 100 volt level. Thus, when the reference bus voltage reaches 100 volts, the reverse-biased Zener diode 54 breaks down, permitting current to flow through an LED 56 of an optoisolator. The activated LED 56 energizes a phototransistor 58. The energized phototransistor 58 pulls a gate 60 of a field-effect transistor (FET) 62 low, turning off the FET 62.

With the FET 62 off, a capacitor 64 begins to charge and the reference bus voltage increases. An increasing reference bus voltage gradually decreases the reverse-bias voltage drop across the Zener diode 54. When reference bus voltage reaches 105 volts, the reverse-bias voltage across the Zener diode 54 falls below the breakdown voltage and the Zener diode 54 shuts off. The resultant absence of current through the LED 56 shuts off the phototransistor 58 of the optoisolator. With the phototransistor 58 turned off, the gate 60 of the FET 62 is no longer clamped low and current begins to flow from a drain 66 to a source 68 of the FET 62. The capacitor 64 now begins to discharge through an inductor 70 and the FET 62 to the negative terminal 28 of the high voltage power supply 20.

The process of capacitor discharge results in a transfer of energy from an electric field of the capacitor 64 to a magnetic field of the inductor 70. As the capacitor 64 discharges, the reference bus falls from the 105 volt level and the reverse-bias voltage across the Zener diode 54 once again approaches the breakdown level. When current again begins to flow through the LED 56, the FET 62 turns off. The abrupt half of current flow through the inductor 70 induces an instantaneous high voltage drop across the inductor 70. The induced voltage forward biases a flyback diode 72, permitting current supplied by the collapsing magnetic field of the inductor 70 to flow into the positive terminal 18 of the high voltage power supply 20.

Thus, the reference bus voltage will ramp alternately between approximately 100 and 105 volts DC. The period of the cycle is determined by the magnitude of the inductance, which preferably should be chosen to provide a cycle period between 10 microseconds and 100 microseconds. The reference bus regulator 30 provides an efficient scheme for maintaining the reference bus 24 at a constant high voltage level. When reference bus voltage is rising, energy is stored in the electric field of the capacitor 64. When reference bus voltage is falling, energy is stored in the magnetic field of the inductor 70 and thereafter transferred back to the high voltage power supply 70. The energy dissipated within the reference bus regulator 30 is thereby minimized.

The scheme 10 for computer sensing of the status of high voltage relay contacts 12 greatly improves the efficiency and reliability of sensing system performance by reducing the energy dissipated by the sensing system. The arrangement 10 provides for use of a lower voltage contact closure input module 14, such as a 24 volt DC module, in cooperation with a reference bus 24 and reference bus regulator 30. Where the arrangement 10 is used for sensing 125 volt DC contacts, the reference bus regulator 30 maintains approximately 100 volts on the reference bus 24. In prior art schemes the 100 volt potential difference falls across a dropping resistor 34 within the input module 14, generating heat when the connected contacts 12 are closed. In the arrangement 10 disclosed herein the energy of the 100 volt potential is not substantially dissipated, but is returned to the high voltage power supply 20. The arrangement 10 thereby permits congregation of a larger number of the high voltage contact closure inputs within a single, sealed data collection cabinet in a hostile plant environment.

We claim:

1. An apparatus enclosed in a data collection cabinet for detecting the state of each pair of contacts in a plurality of contact pairs within said cabinet and for communicating the detected states to a computer, said apparatus comprising:

means for generating a high voltage which may be applied across each of said contact pairs when open;

a plurality of sensing means, each coupled to a corresponding one of said contact pairs for sensing the flow of current from said generating means through said corresponding contact pair when closed and for signaling said computer when current flow is sensed; and means for limiting the voltage across each of said sensing means to a fraction of the voltage of said generating means, said limiting means having means for returning to said generating means a portion of the energy supplied by said generating means so that total heat dissipation in said cabinet is substantially less when said corresponding contact pair is closed than that which would be dissipated if the full voltage of said generating means were applied to each of said sensing means.

2. An apparatus according to claim 1 wherein said voltage controlling means: maintains said connection at an intermediate voltage between the voltage of said voltage supply and earth potential such that said predetermined voltage is applied to said current sensing means when said contacts are closed, with said predetermined voltage being equal to the potential difference between the voltage of said voltage supply and said intermediate voltage.

3. An apparatus according to claim 2 with said voltage supply having a negative terminal and a positive terminal and wherein said sensing means comprises:

a resistor disposed between said negative terminal and the negative side of said contacts, with the positive side of said contacts being connected to said positive terminal, so that the voltage of said voltage supply is applied to said contacts when the contacts are open; and a second resistor, a current detection device in communication with said computer, and a diode serially disposed between the negative side of said contacts and said voltage controlling means to permit current flow from said contacts through said connection to said voltage controlling means when said contacts are closed.

4. An apparatus according to claim 3 wherein the current detection device is an optoisolator comprising a light-emitting diode and a phototransistor.

5. An apparatus according to claim 2 wherein said voltage controlling means is a reference bus regulator which operates in a switching mode, said regulator comprising:

means for storing in an electric field, energy supplied by said voltage supply during a cycle of said regulator wherein the voltage level of the reference bus is rising;

means for storing in a magnetic field, energy supplied by said voltage supply during a cycle of said regulator wherein the voltage level of the reference bus is falling;

means for transferring energy stored in the electric field to the magnetic field during the falling cycle; and means for transferring energy stored in the magnetic field to said voltage supply upon a transition from the falling cycle to the rising cycle.

6. An apparatus according to claim 2 wherein said voltage controlling means is a reference bus regulator which operates in a switching mode, said regulator comprising:

an output terminal for providing a regulated output voltage;

an inductor connected between the output terminal and a drain of a field-effect transistor, the source of which transistor is connected to said negative terminal;

a capacitor connected between the output terminal and said negative terminal;

a Zener diode and a biasing network, including a light-emitting diode of a phototransistor, disposed so that said Zener diode is reverse biased and said light-emitting diode is forward biased between a higher potential at said positive terminal and a lower potential at said output terminal;

a flyback diode disposed so as to be forward biased between a higher potential at the drain of the field-effect transistor and a lower potential at said positive terminal; and a biasing network, including a phototransistor of said optoisolator, connected to a gate of the field-effect transistor, for switching the field-effect transistor off and on.

7. An apparatus enclosed in a data collection cabinet for detecting the state of each pair of contacts in a plurality of contact pairs within said cabinet, said apparatus comprising:

means for generating a high voltage which may be applied across each of said contact pairs when open;

a plurality of sensing means, each coupled to a corresponding one of said contact pairs for sensing the flow of current from said generating means through said corresponding contact pair when closed; and means for limiting the voltage across each of said sensing means to a fraction of the voltage of said generating means, said limiting means having means for returning to said generating means a portion of the energy supplied by said generating means so that total heat dissipation in said cabinet is substantially less when said corresponding contact pair is closed than that which would be dissipated if the full voltage of said generating means were applied to each of said sensing means.

8. A voltage regulator which operates in a switching mode to provide a regulated output voltage, said regulator comprising:

means for storing in an electric field, energy supplied by a power supply during a cycle of said regulator wherein the output voltage level is rising;

means for storing in a magnetic field, energy supplied by the power supply during a cycle of said regulator wherein the output voltage is falling;

means for transferring energy stored in the electric field to the magnetic field during the falling cycle; and means for transferring energy stored in the magnetic field to said power supply upon a transition from the falling cycle to the rising cycle.

9. In a contact status sensing apparatus enclosed in a data collection cabinet for detecting the state of at least one pair of contacts within said cabinet and for communicating said state to a computer, said contact status sensing apparatus being operative with a voltage supply coupled with said contacts for providing a current flow through said contacts, the combination of:

means coupled to said contacts for sensing the flow of current through said contacts when the contacts are closed and for providing a signal to said computer when current flow is sensed; and voltage controlling means coupled to said voltage supply and coupled through a connection to said current sensing means to maintain a predetermined voltage across said current sensing means at a value less than the voltage of said voltage supply, said voltage controlling means having means for returning to said voltage supply a portion of the energy supplied by said voltage supply for reducing total heat dissipation in said data collection cabinet below that which would be dissipated if the full voltage of said voltage supply were applied across said current sensing means.

* * * * *